(12) United States Patent
Mann et al.

(10) Patent No.: US 9,414,526 B2
(45) Date of Patent: Aug. 9, 2016

(54) COOLING APPARATUS WITH DYNAMIC LOAD ADJUSTMENT

(71) Applicant: GLOBALFOUNDRIES INC., Grand Cayman (KY)

(72) Inventors: Phillip V. Mann, Rochester, MN (US); Kevin M. O'Connell, Rochester, MN (US); Arvind K. Sinha, Rochester, MN (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 221 days.

(21) Appl. No.: 14/082,560

(22) Filed: Nov. 18, 2013

(65) Prior Publication Data

US 2015/0138731 A1    May 21, 2015

(51) Int. Cl.
*H05K 7/20* (2006.01)
*H01L 23/40* (2006.01)
*H01L 23/433* (2006.01)
*G06F 1/20* (2006.01)
(Continued)

(52) U.S. Cl.
CPC ............ *H05K 7/20409* (2013.01); *G06F 1/206* (2013.01); *H01L 23/4006* (2013.01); *H01L 23/4093* (2013.01); *H01L 23/433* (2013.01); *H05K 7/20336* (2013.01); *H01L 23/42* (2013.01); *H01L 23/427* (2013.01); *H01L 2924/0002* (2013.01)

(58) Field of Classification Search
CPC .......... H05K 7/20336; H05K 7/20409; H05K 7/20454; H05K 7/20509; H05K 2201/066; H05K 2201/068

USPC ........... 361/679.46, 679.47, 679.54, 715, 719
See application file for complete search history.

(56) References Cited

U.S. PATENT DOCUMENTS 5,052,481 A    10/1991    Horvath et al.
5,270,902 A    12/1993    Bellar et al.
(Continued)

FOREIGN PATENT DOCUMENTS

CN        202957232 U    5/2013

OTHER PUBLICATIONS

Anonymous, Flexible Channeled Lid Design for Organic DCM Module with Dual Actuation Mechanism, IP.com Prior Art Database. Aug. 16, 2011. IP.com No. IPCOM000209807D.
(Continued)

*Primary Examiner* — Tuan T Dinh
*Assistant Examiner* — Mukund G. Patel
(74) *Attorney, Agent, or Firm* — Thompson Hine LLP (57) ABSTRACT

A cooling apparatus is disclosed, which may include multiple heat producing units. The cooling apparatus may also have a thermal interface material (TIM) to facilitate heat transfer away from the heat producing units. The cooling apparatus may also have multiple heat sink columns located above, and designed to conduct heat away from, corresponding heat producing units, through thermally conductive contact with corresponding portions of the TIM layer. The cooling apparatus may also have a load plate located above the heat sink columns, designed to hold the heat sink columns in a relatively fixed position above the heat producing units. The TIM layer may have an initial compressed state between the heat sink columns and the corresponding heat producing units. Each of the heat sink columns may be designed so that, in operation, the corresponding portion of the TIM layer may have a further compressed state.

18 Claims, 5 Drawing Sheets

(51) Int. Cl.
  *H01L 23/42*    (2006.01)
  *H01L 23/427*   (2006.01)

(56) References Cited

U.S. PATENT DOCUMENTS

| | | | |
|---|---|---|---|
| 6,545,879 | B1 | 4/2003 | Goodwin |
| 7,063,127 | B2 | 6/2006 | Gelorme et al. |
| 7,547,582 | B2 | 6/2009 | Brunschwiler et al. |
| 7,808,780 | B2 * | 10/2010 | Brunschwiler et al. .. 361/679.53 |
| 7,855,891 | B1 * | 12/2010 | Ayres, III ........... H05K 7/20445 165/185 |
| 7,876,565 | B2 | 1/2011 | Hoivik et al. |
| 8,063,483 | B2 | 11/2011 | Dimitrakopoulos et al. |
| 8,129,224 | B2 | 3/2012 | Gurrum et al. |
| 2006/0077638 | A1 | 4/2006 | Salmon |
| 2011/0300815 | A1 * | 12/2011 | Thompson et al. .......... 455/90.3 |
| 2013/0258599 | A1 * | 10/2013 | Danello et al. ................ 361/706 |

OTHER PUBLICATIONS

Brunschwiler, T., et al., "Hotspot-adapted Cold Plates to Maximize System Efficiency," 15th International Workshop on Thermal Investigations of ICs and Systems, Leuven, Belgium. Oct. 7-9, 2009. © EDA Publishing/Therminic 2009.

* cited by examiner

COOLING APPARATUS WITH DYNAMIC LOAD ADJUSTMENT

TECHNICAL FIELD

The present disclosure relates to cooling of electronic components. In particular, this disclosure relates to a heat removal device with dynamically adjustable thermal characteristics.

BACKGROUND

A heat sink may be used in computers and electronic systems as a passive heat exchanger, and may act as a reservoir that can absorb an arbitrary amount of heat without significantly changing temperature. Heat sinks may be used in computers, for example, to cool devices such as central processing units (CPUs) and/or graphics processing units (GPUs).

A heat sink may also dissipate heat produced by electronic devices into a medium, such as air, water, or a coolant/refrigerant. Heat sinks may reach a temperature greater than a cooling medium, in order to transfer heat across a thermal gradient from an electronic device to the medium, by convection, radiation, or conduction.

A thermal interface material (TIM) may be used to enhance heat transfer between an electronic device, such as an integrated circuit (IC), and a heat sink, and may be fabricated from thermally conductive material. A TIM may increase thermal conductivity by replacing irregularities and air gaps between adjacent, mating surfaces (e.g., of the IC and the heat sink) with a thermally conductive material.

SUMMARY

Various aspects of the present disclosure may be useful for providing efficient cooling paths for integrated circuits (ICs) and portions of ICs. An adaptive cooling apparatus configured according to embodiments of the present disclosure may dynamically adjust cooling path length for individual regions of circuitry, in response to heat produced by the regions.

Embodiments may be directed towards a cooling apparatus. The cooling apparatus may include a plurality of heat producing units (HPUs), each having a top surface. The cooling apparatus may also include a first thermal interface material (TIM) layer. The first TIM layer may have a top surface, and a bottom surface adjacent to, and in thermally conductive contact with, the top surfaces of the heat producing units, which may facilitate heat transfer away from the heat producing units. The cooling apparatus may also have a plurality of heat sink columns, each with a top surface, and a bottom surface located above a corresponding heat producing unit that is above and in thermally conductive contact with, the top surface of a corresponding portion of the first TIM layer. Each heat sink column may be designed to conduct heat away from the corresponding portion of the first TIM layer. The cooling apparatus may also include a load plate located above the top surfaces of the heat sink columns and designed to, in a latched state, hold the top surfaces of the heat sink columns in a relatively fixed position above the heat producing units. In a latched state, the first TIM layer may have an initial compressed state between the heat sink columns and the corresponding heat producing units, and each of the plurality of heat sink columns may be designed so that, in operation, the corresponding portion of the first TIM layer has a further compressed state.

Embodiments may also be directed towards a method for cooling heat producing units (HPUs). The method may include positioning a first TIM layer on a top surface of at least one HPU of a plurality of HPUs, to facilitate heat transfer away from the at least one HPU. The method may also include positioning a plurality of heat sink columns above corresponding heat producing units and above the first TIM layer, and positioning a load plate above the heat sink columns. The method may include exerting a compressive force on each heat sink column, by moving the load plate into a latched position, and conducting heat away from the first TIM layer with at least one of the plurality of heat sink columns. The method may further include adjusting compression of a first portion the first TIM layer that is above a first heat producing unit by a first amount, and adjusting compression of a second portion of the first TIM layer that is above a second heat producing unit by a second amount that is different than the first amount.

Embodiments may be directed towards a cooling apparatus. The cooling apparatus may include a plurality of heat producing units, each having a top surface, and a first thermal interface material (TIM) layer, having a top surface, and a bottom surface adjacent to the top surfaces of the heat producing units, and configured to facilitate heat transfer away from the heat producing units. The cooling apparatus may also include a plurality of heat sink columns, each column having a top surface, and a bottom surface located above a corresponding heat producing unit and above the top surface of the first TIM layer. Each of the heat sink columns may be configured to conduct heat away from the first TIM layer, and to increase a respective force on the top surface of the corresponding heat producing unit as a result of thermal expansion. The cooling apparatus may also include a load plate, located above the top surfaces of the heat sink columns. The load plate may be configured to, in a latched state, provide at least a portion of the respective force on the top surface of each heat sink column, in a direction normal to the top surface of the column, to compress the first TIM layer between the heat sink column and the corresponding heat producing unit.

Aspects of the various embodiments may be used to enable electronic circuits to operate stably and reliably within a limited operational temperature range. Aspects of the various embodiments may also be useful for providing cost-effective cooling apparatuses for use with heat producing electronic devices, by using existing and proven heat sink, TIM and IC technologies.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of embodiments of the disclosure and are not limiting.

In the drawings and the Detailed Description, like numbers generally refer to like components, parts, steps, and processes

DETAILED DESCRIPTION

Certain embodiments of the present disclosure can be appreciated in the context of increasing the adaptability and efficiency of cooling systems for ICs, or regions of an IC, that may be used in a computer or electronic system. Such IC types may include, but are not limited to, central processing units (CPUs), graphics processing units (GPUs), and interface chips. While not necessarily limited thereto, embodiments discussed in this context can facilitate an understanding of various aspects of the disclosure. Certain embodiments may also be directed towards other equipment and associated applications, such as increasing cooling system adaptability and efficiency for high-power semiconductor devices such as power transistors and amplifiers, which may be used in a wide variety of electronic systems. Such ICs may include, but are not limited to, analog circuits fabricated in various semiconductor technologies. Embodiments may also be directed towards cooling systems for other types of electronic devices including, but not limited to, laser diodes and light emitting diodes (LEDs). The intrinsic heat dissipation capability of these types of devices may be insufficient to moderate the device's temperature, without the use of an additional cooling device.

Various embodiments of the present disclosure relate to adaptive cooling apparatuses configured to remove heat from ICs by thermal conduction, which can be useful for providing robust protection of IC's from damage resulting from high operating temperatures. Stable and reliable performance of an IC may result from the use of an adaptive cooling apparatus. The adaptive cooling apparatus may protect a number of ICs (which may each dissipate a different amount of power), and may be configured to provide independently adapted, efficient cooling paths for each IC. Efficient heat transfer paths provided by the adaptive cooling apparatus may allow ICs to operate safely and reliably at high operating frequencies and workloads.

An adaptive cooling apparatus designed according to certain embodiments may be compatible with existing and proven IC technologies and electronic systems, and may be a useful and cost-effective way to protect ICs from permanent damage. An adaptive cooling apparatus constructed according to embodiments of the present disclosure may protect an IC from high operating temperatures, by responding to heat dissipated by the IC.

Continuing trends in electronic packaging involves increasing electronic circuit density through the placement of various functional units in close proximity to each other, which may provide distinct performance, density and cost advantages over less integrated solutions. The functional units may have a wide variation in the amount of heat they dissipate during operation, resulting both from the type/characteristics of the circuits included in the units, and from the type of workload (throughput) the unit may be executing at a particular time. An integrated electronic device, such as a highly integrated chip (IC), or multi-chip module, may therefore contain a number of regions of circuitry, located adjacent to each other, each having differing power dissipation characteristics from neighboring units.

A heat sink may be used to transfer heat from the chip or module to a medium into which it may be dissipated, for example, air, water, or a refrigerant. A thermal interface material (TIM) may be used to provide a highly conductive thermal path between the heat producing chip or module and the heat sink.

A thermal interface material (TIM) may facilitate heat transfer by filling surface irregularities and air gaps between two mating, thermally conductive surfaces in close proximity with a material having a higher thermal conductivity than air. The thermal conductivity of a TIM layer may be less than the thermal conductivity of a heat sink material, so a corresponding design objective may be to maximize heat transfer by reducing the thickness of the TIM layer to a minimum thickness needed to fill in surface irregularities and air gaps. The thickness of a compressible TIM layer may be reduced by the application of pressure on it surfaces.

A heat sink composed of a single mass of thermally conductive material, for example, a copper or aluminum block, having a surface profile designed to match the profile of one or more heat producing IC's, or sections of an IC, may be used as a heat removal device. A TIM layer may be placed between the IC(s) and the heat sink to enhance thermal conductivity. When one or more ICs (e.g., of a multichip module) are in operation, they may each dissipate varying amounts of heat. For example, a processor chip may dissipate over 100 W, in a highly active state, and a less active device, such as an infrequently accessed memory chip, may dissipate much less power, for example 2 W. The disparity in the amount of heat dissipated by these possibly adjacent heat producing units (HPUs) may result in thermal expansion of their respective chips, and/or local areas of the heat sink. A local thermal expansion may have the effects of changing the compression of a region of the TIM layer, and possibly displacing the heat sink from the chip or multichip module. An overall displacement of the heat sink may result in increased distance between particular regions (HPUs) of the die or multi-chip module, and corresponding mating areas of the heat sink. This increase in distance may increase the thermal resistance and thermal path length across the TIM layer, resulting in a reduction in cooling efficiency for certain heat producing units.

Figure 1:
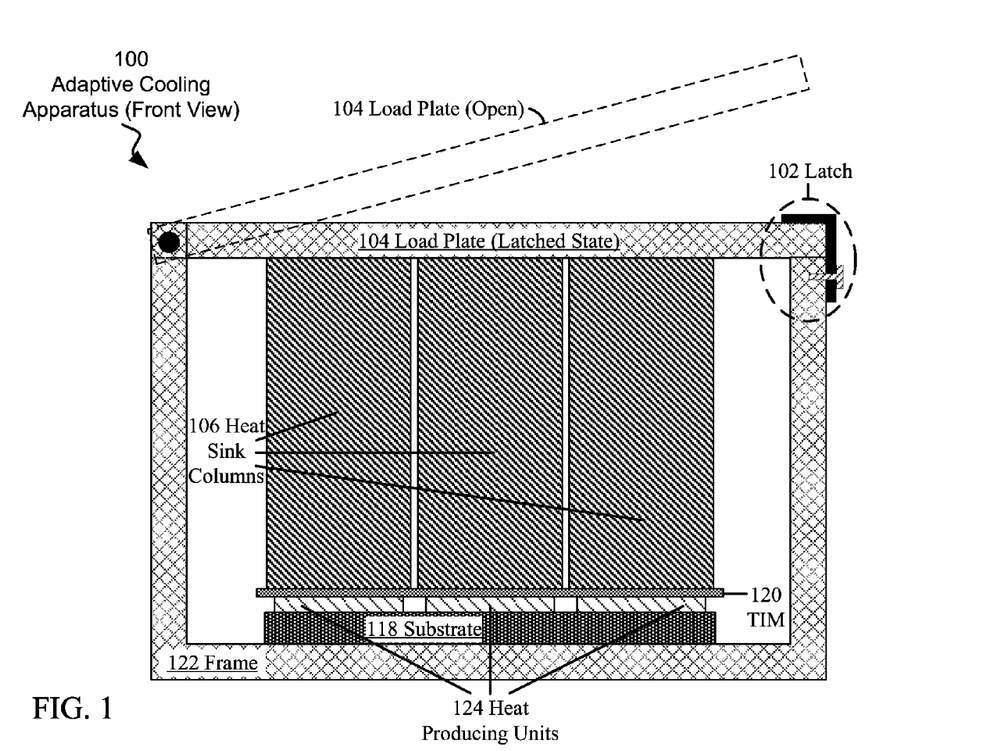
FIG. 1 is a front view of an adaptive cooling apparatus including a load plate, heat sink columns, thermal interface material (TIM) layer, heat producing units (HPUs) and a substrate, according to embodiments of the present disclosure.

Certain embodiments relate to the dynamic adjustment of compressive forces exerted on regions of a TIM, and respective heat producing units (HPUs), by corresponding individual heat sink columns, in response to individual HPU temperature fluctuations. FIG. 1 is a front view of an adaptive cooling apparatus 100, generally used for cooling HPUs 124, according to embodiments of the present disclosure. An adaptive cooling apparatus 100 may include a number of HPUs 124, which may be arranged and/or mounted on a substrate 118. According to certain embodiments, an HPU 124 may be an IC or a region of an IC, and the substrate 118 may be a planar structure used for mechanical mounting and electrical interconnection of ICs, consistent with electronic packaging used in computer and other electronic systems. For example, in certain embodiments, HPUs 124 may be processor chips (ICs), and the substrate 118 may be an organic laminate chip carrier, used to electrically interconnect the processor chips. Adaptive cooling apparatus 100 may dynamically alter its thermal characteristics in response to the amount of heat dissipated by each HPU 124, and may be particularly useful in ensuring reliable operation of HPUs 124.

A bottom surface of the (first) TIM 120 may be located on top of, and in thermally conductive contact with the top surface of HPUs 124. Thermally conductive contact (of two mating surfaces) may enable the transfer of heat from one surface to the other, and may require a specified level of pressure on the surfaces.

TIM 120 may be useful for conducting heat from the HPUs 124 to the heat sink columns 106. The bottom surface of each heat sink column 106 may correspond to a particular HPU 124, and be in thermally conductive contact with the top surface of a corresponding portion of the (first) TIM 120 layer. Heat sink columns 106 may be useful in conducting heat away from, and limiting the operating temperature of HPU 124.

According to embodiments, the load plate 104 may be attached to frame 122, and may (in a latched state) provide a compressive force onto the top surface of the heat sink columns 106. The compressive force may be transferred by heat sink column 106 to TIM 120 and HPUs 124, and used to reduce TIM 120 thickness, relative to an uncompressed TIM 120 thickness. Latch 102 may be useful to secure the load plate 104 in a latched (closed) position. FIG. 1 depicts load plate 104 in both open and latched state (closed) positions.

HPUs 124 may include certain regions of an IC (chip) having heat producing characteristics that may differ from the heat producing characteristics of other, possibly adjacent, regions. An HPU 124 may also be an entire chip, mounted on a substrate, which has heat producing characteristics that may differ from the heat producing characteristics of another chip mounted on the same substrate. Heat producing characteristics may include minimum and maximum HPU power dissipation levels (i.e., wattage). HPU 124 power dissipation may vary based upon both the type of circuits within the HPU 124, and variation in workloads, or activity level of the HPU 124.

As an example, an HPU 124 may be a processor chip which may dissipate more than 100 W, when running a certain (high utilization) workload, and may consume less than 10 W while running in an "idle" (low utilization) state. Another type of HPU 124, for example, may be a dynamic random-access memory (DRAM) chip, which may dissipate less than 8 W when it is heavily accessed and approximately 1 W when it is not being accessed. An HPU may also be a certain region of circuitry on an IC, such as a processor core, memory unit, or RF transmitter circuit.

The (first) TIM layer 120 may have an initial compressed state height between the heat sink columns 106, and the corresponding heat producing units 124. The initial compressed height of TIM 120 may result from the compressive force applied by the load plate 104, in a direction normal to the top of the heat sink column(s) 106, and transferred to the TIM layer 120 by corresponding heat sink column(s) 106. This initial compressed state height may be useful in producing a limited thermal path length (through the TIM 120 layer), and limiting the thermal resistance of the TIM layer 120, which may enable efficient heat transfer between an HPU 124 and a heat sink column 106.

In certain embodiments, thermal expansion of one or more of the heat sink columns 106 may result in increased compressive force on the top surface of the corresponding portions of the TIM 120, and on the heat producing unit(s) 124. The increase in force on the TIM 120 may cause it to further compress, which may result in a decrease of thermal path length and thermal resistance (relative to the initial compressed state), and a corresponding increase in heat transfer efficiency between an HPU 124 and a heat sink column 106.

According to embodiments, a heat sink column 106 may be fabricated from a number of thermally conductive materials, including, but not limited to, aluminum, aluminum alloys, copper, graphite, and carbon nanotube composites. Each of the heat sink columns 106 may be designed so that, during operation of the HPUs 124, the thermal expansion of the heat sink column 106 (in response to heat received from a corresponding HPU 124) compresses a corresponding portion of the first TIM 120 layer, to a further compressed state, which may be thinner than the initial compressed state (before heat sink column 106 thermal expansion) of the first TIM 120 layer.

Each heat sink column 106 may have a certain coefficient of thermal expansion (CTE), derived from characteristics of a material or set of materials it is fabricated from. Individual heat sink columns may be fabricated from different materials and/or sets of materials, and thus may be designed to have different CTEs. Heat sink columns may also be designed with differing initial (unexpanded) heights, i.e., the distance between the top surface and the bottom surface of a heat sink column 106. Individual heat sink column 106 CTEs may be useful in adjusting the resulting compression of a portion of the TIM 120 layer corresponding to a certain HPU 124. Individual heat sink column 106 initial heights may be useful in compensating for variations among of the thicknesses of certain HPU 124 chips, and/or thickness of HPU 124 chip interconnect (e.g., solder balls) to a substrate 118.

According to certain embodiments, the design of adaptive cooling apparatus 100 may enable each heat sink column 106 to expand and contract independently from other heat sink columns 106, in response to the individual levels of heat produced by their corresponding HPUs 124. The ability of heat sink columns 106 to independently respond to their respective HPUs 124 may be useful in preventing the thermal expansion of one HPU 124, or of a certain heat sink column 106, from causing increased separation between another HPU 124 and its respective heat sink column 106. Increased distance between an HPU 124 and a heat sink column 106 may cause an increased TIM 120 thickness, and may reduce heat transfer efficiency for a particular HPU 124, according to embodiments.

A heat sink column 106 may dissipate heat through the use of cooling fins (for air cooling), embedded or attached fluid channels (for water or refrigerant-based cooling), or attachment to a heat pipe (for phase-change cooling). Heat dissipation from the heat sink columns 106 may create a thermal gradient across the heat sink column 106, which may allow continued heat removal from HPU(s) 124.

The load plate 104 may be located above the top surfaces of the heat sink columns 106, and maybe designed to (in a latched state) maintain the top surfaces of the heat sink columns 106 in a relatively fixed (coplanar) position above the HPUs 124. The connection of the load plate 104 to the (rigid) frame 122, which may also extend below substrate 118, may enable this relatively fixed positioning of the top surfaces of the heat sink columns 106 relative to the substrate 118. The frame may include a backing (stiffening) plate located below the substrate 118, which may used to support it.

Figure 2:
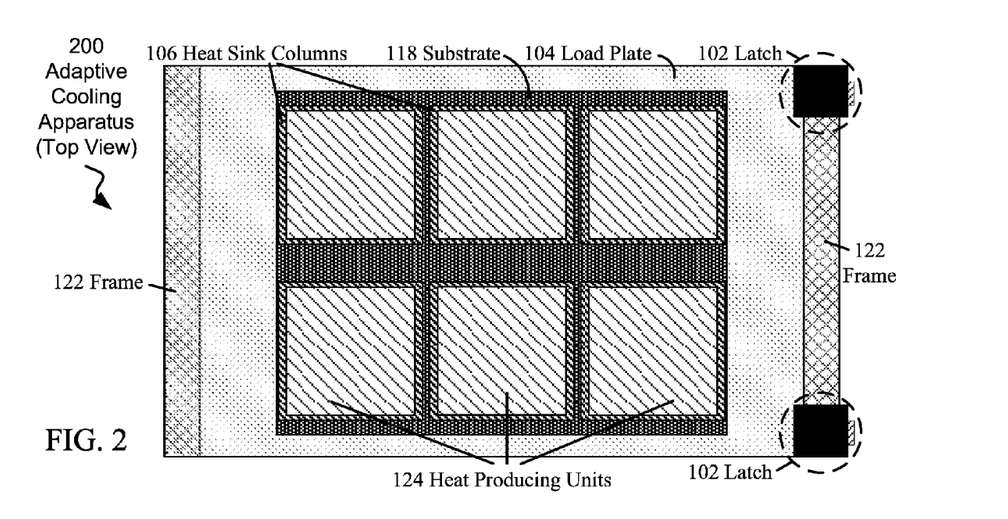
FIG. 2 is a top view of an adaptive cooling apparatus including a load plate, heat sink columns, HPUs and a substrate, according to embodiments.

FIG. 2 is a top view of an adaptive cooling apparatus 200, consistent with FIG. 1, and including a load plate 104, heat sink columns 106, heat producing units 124, frame 122, latches 102, and a substrate 118, according to embodiments. The bottom surface of heat sink columns 106 may be designed to overlap the top surfaces of HPUs 124, which may be useful in utilizing the entire area of the top surfaces of the HPUs for heat transfer. FIG. 2 illustrates HPUs 124 arranged in a 2-dimensional array, according to embodiments. Certain embodiments may include HPUs 124 arranged in a 1-dimensional array. Embodiments may include HPUs 124 and corresponding heat sink columns 106 having various sizes and shapes. Embodiments may include guides or other hardware elements designed to maintain appropriate alignment of heat sink columns 106 relative to HPUs 124.

Figure 3:
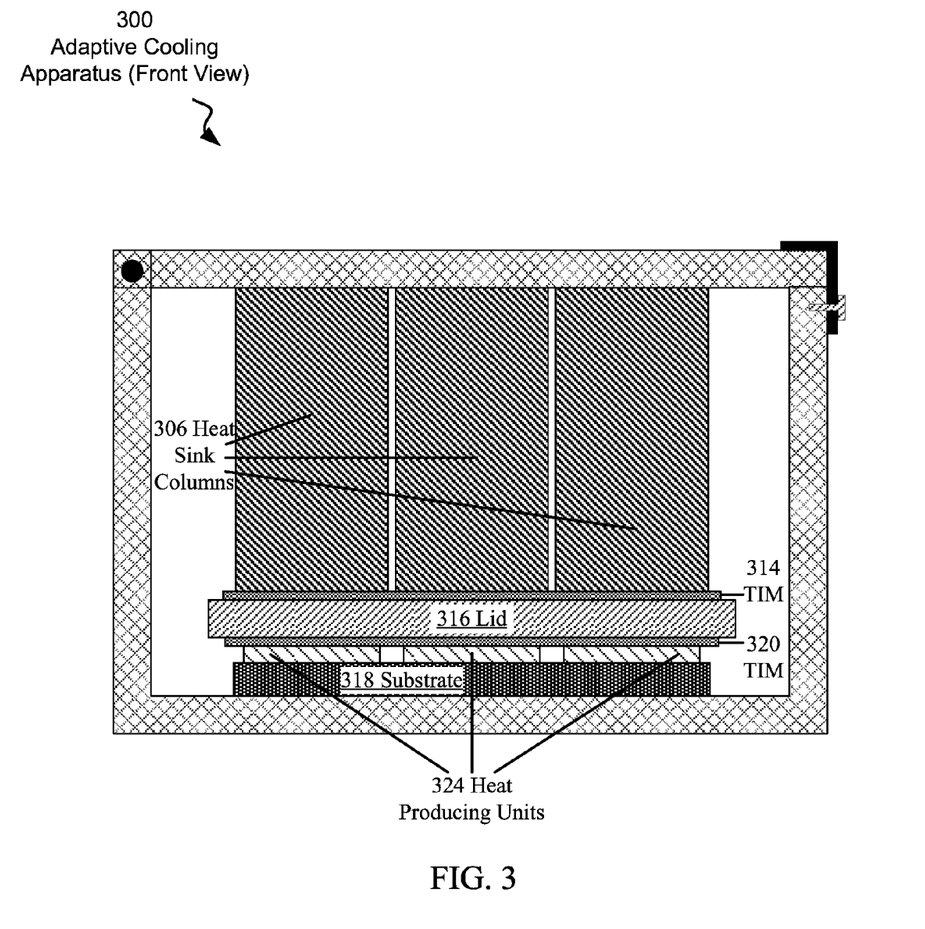
FIG. 3 is a front view of an adaptive cooling apparatus including two thermal interface material (TIM) layers, a lid, heat producing units and a substrate, according to embodiments.

FIG. 3 is a front view of an adaptive cooling apparatus 300, similar to FIG. 1, including (first) TIM layer 320, (second) TIM layer 314, a lid 316, heat sink columns 306, heat producing units 324, and a substrate 318, according to embodiments. The lid 316 may be located on, and in thermally conductive contact with, the top surface of the (first) TIM layer 320. Second TIM layer 314 may be located between, and in thermally conductive contact with the lid 316 and the bottom surface of the heat sink columns 306. The lid 316 may be useful for spreading heat dissipated by one or more of the heat producing units 324 to a larger surface area, where it may be more effectively removed. Lid 316 may also be useful in providing one or more of the HPUs 324 with shielding from ESD events, and provide mechanical stability for the assembly of substrate 318, HPUs 324 and lid 316. In certain embodiments, a lid 316 may consist of a planar section of thermally conductive material, such as copper or aluminum. In certain embodiments, the lid 316 may include sides used to further encompass HPUs 324. In certain embodiments, the lid 316 may cover or encompass one or more than one HPU 324.

View 300 depicts heat sink columns 306 positioned in a latched state, which may cause a compressive force to be exerted on both TIM 314 and TIM 320, which may result in the compression of both TIMs, relative to an uncompressed state of the TIMs 314, 320. The amount of compression of each TIM 314 and TIM 320 may depend on the type of material used for each TIM, according to embodiments.

Figure 4:
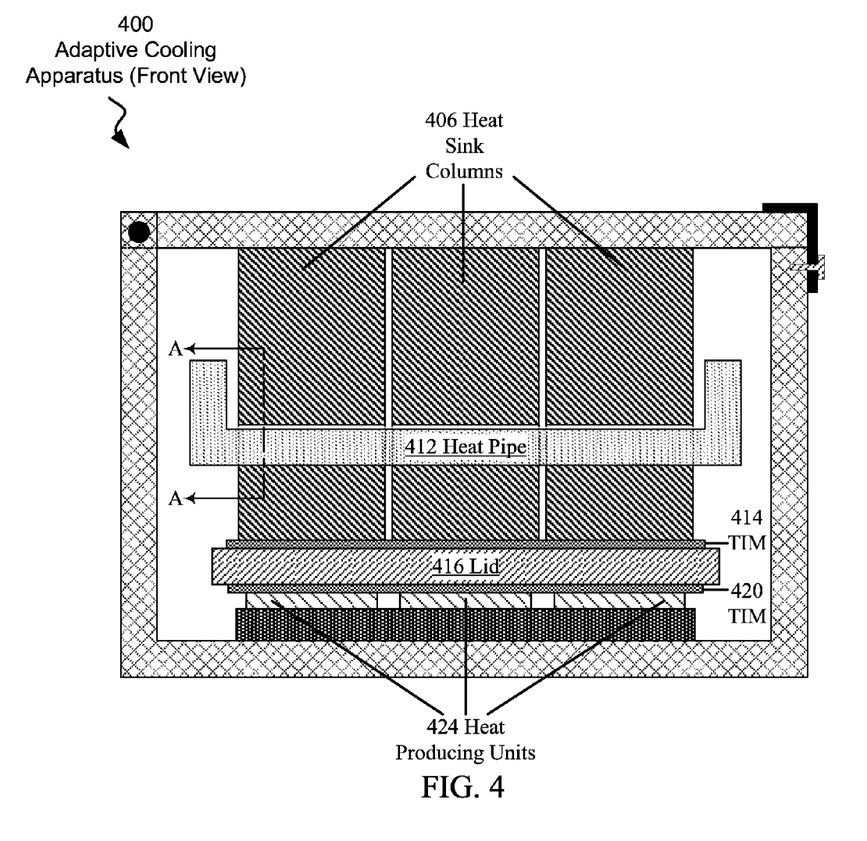
FIG. 4 is a front view of an adaptive cooling apparatus including a heat pipe, two thermal interface material (TIM) layers, and a lid, according to embodiments.

FIG. 4 is a front view of an adaptive cooling apparatus 400, consistent with FIG. 1, and including a heat pipe 412, heat sink columns 406 two thermal interface material (TIM) layers 414, 420, and a lid 416, according to certain embodiments. A heat pipe 412 may be attached to, and in thermally conductive contact with, at least one heat sink column 406. Heat pipe 412 may be useful for to equalize temperature (transfer heat) from one sink column 406 to another or to remove heat from a particular heat sink column 406, corresponding to a particular HPU 424.

A heat pipe 412 may be thermally connected to a heat sink column 406 by a soldered connection, consistent with connections used in electronics and mechanical assembly. A soldered connection may create a more robust and efficient thermal path between the heat pipe 412 and a heat sink column 406 than may be created with other materials (e.g., a TIM layer). The heat pipe 412 may also be useful in transferring heat from HPUs 424 by coupling heat sink columns to other dissipative structures or devices such as heat exchangers and/or fin assemblies. A heat pipe 412 may be consistent with phase-change heat pipes used in computer, electronic and other industries, and may include a coolant contained in a hollow, sealed, thermally conductive structure.

Figure 5:
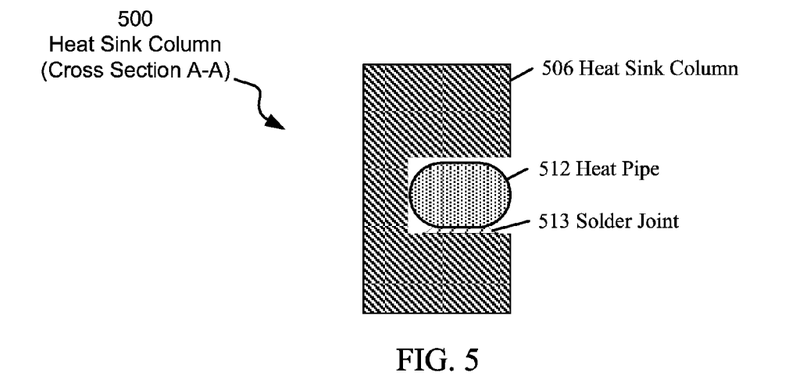
FIG. 5 is a cross-sectional view of a heat pipe attached to a heat sink column, according to embodiments.

FIG. 5 depicts a cross-sectional view 500 of a heat pipe 512 attached to a heat sink column 506 by a solder joint 513, according to embodiments. The solder joint 513 may provide a thermally conductive path through which heat may flow between the heat sink column 506 and the heat pipe 512. In embodiments, the solder joint 513 may be created using solder compounds and fluxes consistent and compatible with those used in the electronics and mechanical assembly industries, such as various tin/lead and lead-free alloys. A solder joint is depicted between one pair of mating surfaces of heat sink 506 and heat pipe 517, however embodiments may include joints between multiple pairs of mating surfaces.

Figure 6:
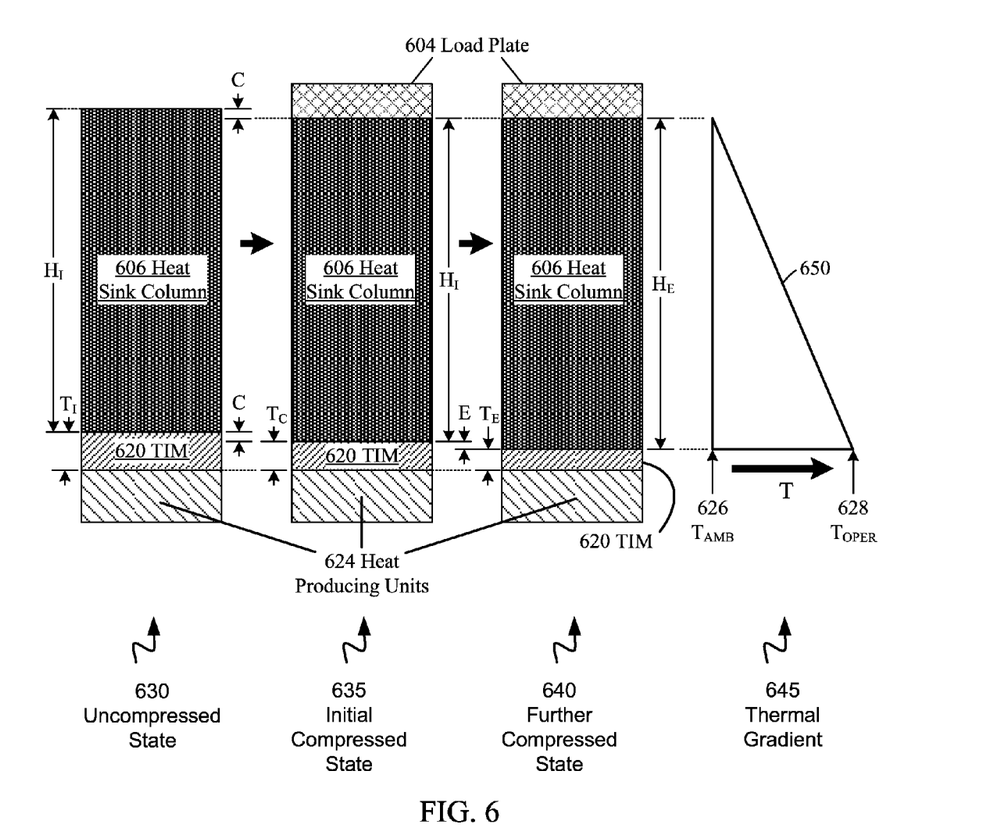
FIG. 6 includes 3 front views of a heat sink column, and a thermal gradient corresponding to an expanded heat sink column, according to embodiments.

FIG. 6 includes 3 front views (630, 635 and 640) of an arrangement of a heat sink column 606, a TIM 620, and a HPU 624, according to embodiments consistent with FIG. 1. FIG. 6 also includes a depiction of a thermal gradient (view 645), corresponding to a heat sink column in an expanded state (606, view 640), according to embodiments.

The depiction of TIM 620, located between HPU 624 and heat sink column 606, in view 630, illustrates an uncompressed state of the TIM 620, corresponding to a lack of compressive force from a load plate (e.g., 104, FIG. 1), according to embodiments. This may result from the load plate (104, FIG. 1) either being in an open position (FIG. 1), or being detached from the frame (122, FIG. 1). In this state, the temperature of heat sink column 606 may be equal to an ambient temperature, $T_{AMB}$ 626, such as room temperature, and may have an (unexpanded) initial height, $H_I$, and the TIM 620 may have an uncompressed thickness, $T_I$.

Initial height $H_I$, of heat sink column 606, may be based on a thermal mass used to cool HPU 624, a specified amount of thermal expansion of the heat sink column 606, cooling apparatus cost and size limitations, and other design constraints, according to embodiments. As an example, $H_I$ may be specified to be 3 cm (30,000 μm). An uncompressed thickness, $T_I$, of TIM 620, may generally be specified to be very small, compared to $H_I$. A $T_I$ for an indium layer, for example, may be 0.25 mm (250 μm). The value of $T_I$ may vary based upon the type of TIM layer 620, and related design constraints, such as a specified thermal resistance.

View 635 depicts an initial compressed state of TIM 620, resulting from the application of a compressive force on the top of heat sink column 606, by load plate 604, according to embodiments. This compressive force may result from load plate 604 being moved into a latched position (see 104, FIG. 1). The compressive force may result in heat sink column 606 being displaced downwards by a distance, C, from its initial position (view 630). Correspondingly, the thickness of TIM 620 may be reduced by a compression distance of C, to a compressed thickness, $T_C$. The reduction in thickness (thermal path length) of the TIM 620 (from $T_I$ to $T_C$) between the HPU 624 and the heat sink column 606, may result in lower thermal resistance, and the more efficient transfer of heat from the HPU 624 to the heat sink column 606. In the initial compressed (view 635), heat sink column 606 may be maintained at the ambient temperature, and (unexpanded) initial height, $H_I$.

As an example, the value of C may be 100 μm. A compressed thickness, $T_C$, may therefore be calculated as:

$$T_C = T_I - C, or$$

$$250\ \mu m - 100\ \mu m = 150\ \mu m\ (0.150\ mm).$$

View 640 depicts a further compressed state of TIM 620. In this state, HPU 624 may generate heat that may be subsequently transferred to heat sink column 606, causing it to thermally expand, by a change in length (E), to an expanded height $H_E$, which may be greater than its initial height, $H_I$.

The change of height (E) of the heat sink column 606, due to thermal expansion, may be expressed by the (simplified) equation:

$$E = H_I \times CTE \times \Delta T$$

Where:

$H_I$=Initial height of heat sink column 606

CTE=the column's 606 coefficient of thermal expansion, which may be expressed in units of parts-per-million per degree Celsius (PPM/° C.).

$\Delta T$=the (average) change in temperature of the heat sink column 606

As an example, if the initial height, $H_I$, of heat sink column 606 is 3 cm (30,000 μm), and the heat sink column 606 is fabricated from aluminum, having a CTE of 22.2 (PPM/° C.), and an average ΔT (over the height of the heat sink column 606) is 25° C., then the change of height (E) may be calculated as:

$$E = 30{,}000\ \mu m \times 22.2\ \text{PPM/°C.} \times 25°\text{C.} = 16.65\ \mu m$$

(11% of the compressed thickness of 150 um)

An expanded height, $H_E$, of heat sink column 606, $H_E$, may be calculated as:

$$H_E = H_I + E,\ \text{or}\ 30{,}000\ \mu m + 17\ \mu m = 30{,}017\ \mu m\ (30.017\ \text{mm}).$$

The expansion of heat sink column 606 may result in an increase in compressive force applied to the TIM 620, which may further compress it, and reduce its thickness by an amount (E), from $T_C$ to $T_E$. The compressive force applied to TIM 620 in view 640 may be the sum of the initial compressive force from load plate 604, and the additional compressive force, resulting from the thermal expansion of heat sink column 606.

A further compressed thickness, $T_E$, may therefore be calculated as:

$$T_E = T_C - E,\ \text{or}\ 150\ \mu m - 17\ \mu m = 133\ \mu m\ (0.133\ \text{mm}).$$

The further reduction in thickness of the TIM 620, (from $T_C$ to $T_E$), may result in a shorter thermal path, $T_E$, between the HPU 624 and the heat sink column 606, which may result in a further lowering of thermal resistance, and more efficient heat transfer to the heat sink column 606. In certain embodiments, the change in length (E), due to thermal expansion of heat sink column 606 may be as high as 30% of a compressed thickness, $T_C$, of TIM 620. In some embodiments, E may be as low as 10% of $T_C$.

In embodiments, a heat sink column 606 may expand or contract in response to an increase or decrease, respectively, of its temperature, which may result from heat transferred from HPU 624. This expansion and contraction may be useful in varying the thickness of TIM 620, and thus providing a shorter thermal path and more efficient cooling of HPU 624, during periods of high heat dissipation from HPU 624. More efficient cooling of HPU 624 may result in a lower chip operating temperature, and more reliable operation.

View 645 depicts a thermal gradient corresponding to view 640 of heat sink column 606, which may have a bottom surface coupled to, and receiving heat from, heat producing unit 624, through TIM 620. The operating temperature of the bottom surface of heat sink column 606 is depicted as $T_{OPER}$ 628. The top surface of heat sink column 606 may have a temperature $T_{AMB}$ 626, less than the operating temperature $T_{OPER}$ 628. $T_{AMB}$ 626 may be an ambient temperature of a cooling medium (such as surrounding air), or may be a temperature above the temperature of the medium. The X-axis of view 645 corresponds to the relative temperature, between $T_{AME}$ 626 and $T_{OPER}$ 628, of locations along the height of the heat sink column 606 (view 640). The Y-axis corresponds to a location on the heat sink column 606 relative to HPU 624. The line 650 may indicate the temperature gradient between the ends (top and bottom surfaces) of heat sink column 606. The temperature gradient 650 may be linear in some embodiments, and may not be linear in certain embodiments. Embodiments that include a heat pipe (412, FIG. 4) may have a temperature gradient differing from 650, resulting from the effectiveness of the heat pipe as a heat transfer device.

Specific numerical dimensions, temperatures, temperature gradients and CTEs discussed herein are included as examples, for the illustration of operating principles of the present disclosure, and do not limit the disclosure in any way.

A variety of materials, with associated material properties, such as CTE and thermal conductivity, may be used in the practice of the present disclosure.

Figure 7:
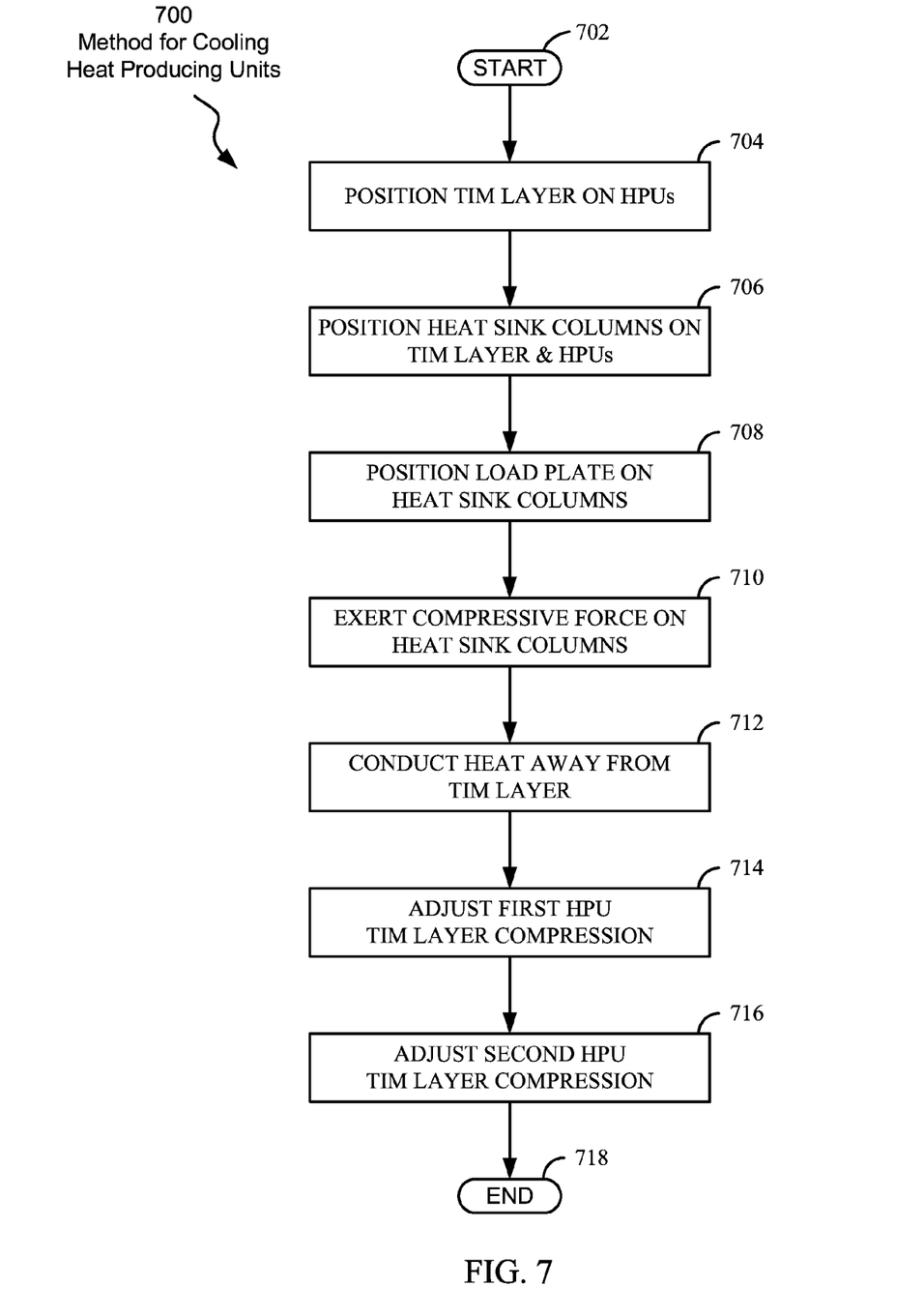
FIG. 7 is a flow diagram illustrating a method for cooling heat producing units, according to embodiments.

FIG. 7 is a flow diagram illustrating a method for cooling heat producing units, according to embodiments. The process 700 moves from start 702 to operation 704. Operation 704 generally refers to positioning a TIM layer on top of at least one of a plurality of HPUs, as depicted, for example by 120 (FIG. 1). The TIM layer may be, for example, a carbon fiber pad or a thermal grease/paste. The TIM layer may be positioned to completely cover the top surface of one or more HPUs, in order to enable efficient heat transfer from the HPU to a corresponding heat sink column. A TIM layer or material may be chosen to have a specified thickness, compressibility, and thermal conductivity, to be suitable for a particular application. Alignment holes or guides may be used in conjunction with a TIM layer, for example, a carbon fiber pad, in order to facilitate positioning it on top of one or more HPUs. A TIM material that is a thermal grease/paste may be applied, at a controlled thickness, to the HPU(s) by the use of a spreader or a squeegee. Once the TIM layer is positioned on top of at least one HPU the process moves to operation 706.

Operation 706 generally refers to positioning one or more heat sink columns on top of the TIM layer and one or more HPU, as depicted, for example by 106 (FIG. 1). A heat sink column may be manufactured with a planar, smooth bottom surface, which may limit surface irregularities, air gaps, and thermal resistance between the heat sink column and a mating surface of a corresponding HPU. The bottom surface of the heat sink column may also be designed to overlap and completely cover the corresponding top surface of the HPU, in order to efficiently use the top surface of the HPU for heat transfer. A frame (e.g. 122, FIG. 1) may include members used to align heat sink columns such as 106 (FIG. 1) with HPUs such as 124 (FIG. 1). Once one or more heat sink columns are positioned on top of the TIM layer and one or more HPU, the process moves to operation 708.

Operation 708 generally refers to positioning a load plate on the top surface of one or more heat sink columns. The load plate may be attached to a frame (e.g., 122, FIG. 1) by a hinge, clips, or a latch (e.g., 102, FIG. 1), and may have a bottom planar surface designed to contact, and exert a force on, a top planar surface of one or more heat sink columns. Once the load plate is positioned on the top surface of one or more heat sink columns, the process moves to operation 710.

Operation 710 generally refers to exerting a compressive force on one or more heat sink columns by placing the load plate in a latched position. The height of the heat sink columns may be designed, in conjunction with a selected TIM layer, to transfer a compressive force from the load plate, in a latched position, to the TIM layer. The heat sink columns may have a variety of heights designed to be compatible with ranges of HPU heights and TIM thicknesses. The latch (e.g., 102, FIG. 1) may be used to secure the load plate (e.g., 104, FIG. 1) to the frame (e.g., 122, FIG. 1) once the load plate is moved into the latched position. Once a compressive force is exerted on one or more heat sink columns the process moves to operation 712.

Operation 712 generally refers to conducting heat away from the TIM layer (and corresponding HPU) by a heat sink column. When the heat sink column(s), TIM layer, and corresponding HPU(s) are compressed together by the force exerted by the load plate, and an HPU dissipates heat, the heat may be conducted from the HPU, through the TIM, and into the corresponding heat sink column. Once heat is conducted away from the TIM layer, the process moves to operation 714.

Operation 714 generally refers to adjusting compression of a portion of a TIM layer corresponding to a (first) HPU. As the (first) HPU dissipates heat, the corresponding, thermally connected heat sink column may increase in temperature, causing it to expand. This expansion against the load plate may increase the compressive force exerted on the corresponding TIM layer, causing a reduction in the thermal path length between the HPU and the heat sink column. This reduction and thermal path length may result in more efficient heat transfer between the HPU and the heat sink column. Once the (first) HPU TIM layer compression is adjusted the process moves to operation 716.

Operation 716 generally refers to adjusting compression of a portion of a TIM layer corresponding to a (second) HPU. As the (second) HPU dissipates heat, the corresponding, thermally connected, heat sink column may increase in temperature, causing it to expand. This expansion against the load plate may increase the compressive force exerted on the corresponding TIM layer, causing a reduction in the thermal path length between the HPU and the heat sink column. This reduction and thermal path length may result in more efficient heat transfer between the HPU and the heat sink column. The amount of expansion of the second HPU, and compression of the corresponding portion of the TIM layer may be different than, and independent of, the amount of expansion of the first HPU, as a result of possibly differing amounts of heat dissipated by the first and second HPUs. The expansion of heat sink columns in operations 714 and 716 may be proportional to a thermal gradient across the height of each respective heat sink column. Once the (second) HPU TIM layer compression is adjusted the process 700 may end at block 718.

Although the present disclosure has been described in terms of specific embodiments, it is anticipated that alterations and modifications thereof may become apparent to those skilled in the art. Therefore, it is intended that the following claims be interpreted as covering all such alterations and modifications as fall within the true spirit and scope of the disclosure.

What is claimed is:

1. A cooling apparatus comprising:
a plurality of heat producing units, each having a top surface;
a first thermal interface material (TIM) layer, having:
a top surface; and
a bottom surface adjacent to, and in thermally conductive contact with, the top surfaces of the heat producing units, to facilitate heat transfer away from the heat producing units;
a plurality of heat sink columns, each having:
a coefficient of thermal expansion;
a top surface; and
a bottom surface located above a corresponding heat producing unit that is above and in thermally conductive contact with, the top surface of a corresponding portion of the first TIM layer, each heat sink column configured to conduct heat away from the corresponding portion of the first TIM layer, the coefficient of thermal expansion for at least one of the heat sink columns being different from at least one other of the heat sink columns; and
a load plate located above the top surfaces of the heat sink columns and configured to, in a latched state, hold the top surfaces of the heat sink columns in a relatively fixed position above the heat producing units, wherein:
the first TIM layer has an initial compressed state between the heat sink columns and the corresponding heat producing units while the heat sink columns are at an ambient temperature;
each of the plurality of heat sink columns has an unexpanded height at the ambient temperature that causes the corresponding portion of the first TIM layer to have a first thickness in the initial compressed state, and an expanded height at an operating temperature that causes the corresponding portion of the first TIM layer to have a second thickness in a further compressed state; and
at least one of the heat sink columns is configured so that a difference between the expanded height and the unexpanded height is between 10% and 30% of the first thickness.

2. The cooling apparatus of claim 1, further comprising a second TIM layer and a lid, the lid being located on, and in thermally conductive contact with, the top surface of the first TIM layer, and the second TIM layer located between, and in thermally conductive contact with the lid and the bottom surface of the heat sink columns.

3. The cooling apparatus of claim 1, further comprising a heat pipe attached to, and in thermally conductive contact with, a heat sink column of the plurality of heat sink columns and configured to remove heat from the heat sink column.

4. The cooling apparatus of claim 3, wherein the heat pipe is attached to, and in thermally conductive contact with, the heat sink column by a soldered connection.

5. The cooling apparatus of claim 1, wherein the further compressed state of the first TIM layer results in a thermal path between at least one heat producing unit and a respective heat sink column that is shorter than a corresponding thermal path in the initial compressed state.

6. The cooling apparatus of claim 5, wherein the thermal path results in a thermal resistance between the at least one heat producing unit and the respective heat sink column that is less than a corresponding thermal resistance in the initial compressed state.

7. The cooling apparatus of claim 1, wherein the heat producing units are integrated circuit chips mounted on a surface of an electronic module.

8. The cooling apparatus of claim 1, wherein the heat producing units are regions of an integrated circuit chip.

9. The cooling apparatus of claim 1, wherein a distance between a first top surface of a first heat sink column and a first bottom surface of the first heat sink column is different than a distance between a second top surface of a second heat sink column and a second bottom surface of the second heat sink column.

10. The cooling apparatus of claim 1, wherein a first heat sink column is configured to thermally expand independently from a second heat sink column.

11. The cooling apparatus of claim 1, wherein the load plate is configured, in a latched state, to maintain coplanarity of the top surfaces of each heat sink column of the plurality of heat sink columns.

12. The cooling apparatus of claim 1, wherein a heat sink column includes at least one thermally conductive material of a group consisting of: aluminum, aluminum alloys, copper, graphite, and carbon nanotube composites.

13. A cooling apparatus for use with a plurality of heat producing units each having a top surface, and a first thermal interface material (TIM) layer having a top surface and a bottom surface adjacent to the top surfaces of the heat producing units, and configured to facilitate heat transfer away from the heat producing units, the cooling apparatus comprising:

a plurality of heat sink columns, each column having a coefficient of thermal expansion, a top surface, and a bottom surface located above a corresponding heat producing unit and above the top surface of the first TIM layer, the coefficient of thermal expansion for at least one of the heat sink columns being different from at least one other of the heat sink columns, each heat sink column configured to:

conduct heat away from the first TIM layer;

increase a respective force on the top surface of the corresponding heat producing unit as a result of thermal expansion of a corresponding heat sink column from an unexpanded height to an expanded height;

a load plate located above the top surfaces of the heat sink columns and configured to, in a latched state:

provide at least a portion of the respective force on the top surface of each heat sink column, in a direction normal to the top surface of the column, to compress the first TIM layer between the heat sink column and the corresponding heat producing unit into an initial compressed state having a first thickness while the heat sink column is at the unexpanded height, and into a further compressed state having a second thickness while the heat sink column is at the expanded height, wherein at least one of the heat sink columns is configured so that a difference between the expanded height and the unexpanded height is between 10% and 30% of the first thickness.

14. The cooling apparatus of claim 13, further comprising a second TIM layer and a lid, the lid being located on the top surface of the first TIM layer, and the second TIM layer being located between the lid and the bottom surface of the heat sink columns.

15. The cooling apparatus of claim 13, further comprising a heat pipe attached to, and configured to remove heat from, at least one of the heat sink columns.

16. The cooling apparatus of claim 15, wherein the heat pipe is attached to at least one of the heat sink columns by a soldered connection.

17. The cooling apparatus of claim 13, wherein compression of the first TIM layer results in a shorter thermal path between at least one heat producing unit and a respective heat sink column.

18. The cooling apparatus of claim 17, wherein the shorter thermal path results in decreased thermal resistance between the at least one heat producing unit and a respective heat sink column.

* * * * *